US008587065B2

(12) United States Patent
Chen et al.

(10) Patent No.: US 8,587,065 B2
(45) Date of Patent: Nov. 19, 2013

(54) LOCAL BOTTOM GATES FOR GRAPHENE AND CARBON NANOTUBE DEVICES

(75) Inventors: Zhihong Chen, West Lafayette, IN (US); Aaron D. Franklin, Croton on Hudson, NY (US); James B. Hannon, Mahopac, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 13/364,273

(22) Filed: Feb. 1, 2012

(65) Prior Publication Data

US 2012/0145998 A1 Jun. 14, 2012

Related U.S. Application Data

(62) Division of application No. 12/563,553, filed on Sep. 21, 2009, now Pat. No. 8,124,463.

(51) Int. Cl.
*H01L 27/01* (2006.01)
*H01L 27/12* (2006.01)
*H01L 31/0392* (2006.01)

(52) U.S. Cl.
USPC ............................................. 257/347; 257/24

(58) Field of Classification Search
USPC ..................... 257/347, 24, E29.168
See application file for complete search history.

(56) References Cited

U.S. PATENT DOCUMENTS

| 7,037,767 | B2 | 5/2006 | Hirai |
| 7,170,120 | B2 | 1/2007 | Datta et al. |
| 7,297,977 | B2 | 11/2007 | Hoffman et al. |
| 7,368,791 | B2 | 5/2008 | Zhang et al. |
| 7,482,232 | B2 | 1/2009 | Appenzeller et al. |
| 7,714,386 | B2 | 5/2010 | Pesetski et al. |
| 7,936,040 | B2 | 5/2011 | Wu |
| 2006/0183278 | A1 | 8/2006 | Bertin et al. |
| 2007/0158642 | A1 | 7/2007 | Gruner |
| 2008/0135892 | A1 | 6/2008 | Finnie |
| 2009/0020764 | A1 | 1/2009 | Anderson et al. |
| 2009/0166686 | A1 | 7/2009 | Hunt et al. |

OTHER PUBLICATIONS

J. Appenzeller, "Carbon Nanotubes for High-Performance Electronics—Progress and Prospect," Proceedings of the IEEE, vol. 96, No. 2, pp. 201-211 (Feb. 2008).
D. Farmer et al., "Atomic Layer Deposition on Suspended Single-Walled Carbon Nanotubes via Gas-Phase Noncovalent Functionalization," Nano Letts., 6(4): 699-703 (2006).
Y. Lu et al., "DNA Functionalization of Carbon Nanotubes for Ultrathin Atomic Layer Deposition of High k Dielectrics for Nanotube Transistors with 60 mV/Decade Switching," JACS, vol. 128, pp. 3518-3519 (2006).

(Continued)

*Primary Examiner* — Cuong Q Nguyen
(74) *Attorney, Agent, or Firm* — Vazken Alexanian; Michael J. Chang, LLC

(57) ABSTRACT

Transistor devices having nanoscale material-based channels and techniques for the fabrication thereof are provided. In one aspect, a transistor device includes a substrate; an insulator on the substrate; a gate embedded in the insulator with a top surface of the gate being substantially coplanar with a surface of the insulator; a dielectric layer over the gate and insulator; a channel comprising a carbon nanostructure material formed on the dielectric layer over the gate, wherein the dielectric layer over the gate and the insulator provides a flat surface on which the channel is formed; and source and drain contacts connected by the channel. A method of fabricating a transistor device is also provided.

15 Claims, 3 Drawing Sheets

(56) References Cited

OTHER PUBLICATIONS

A. Javey et al. "High k Dielectrics for Advanced Carbon-Nanotube Transistors and Logic Gates," Nature Mater., vol. 1, 241-246 (2002).

S. Kim et al., "Realization of a High Mobility Dual-Gated Graphene Field-Effect Transistor with Al2O3 Dielectric," Applied Physics Letters, vol. 94, pp. 062107 (2009).

Song, "Local-Gating Carbon-Nanotube Transistor with Poly-Si Bottom Gates," Journal of the Korean Physical Society, vol. 54, No. 4, pp. 1742-1745 (Apr. 2009).

900

1000

1100

1200

LOCAL BOTTOM GATES FOR GRAPHENE AND CARBON NANOTUBE DEVICES

CROSS-REFERENCE TO RELATED APPLICATION(S)

This application is a divisional of U.S. application Ser. No. 12/563,553 filed on Sep. 21, 2009, the contents of which are incorporated by reference herein.

STATEMENT OF GOVERNMENT RIGHTS

This invention was made with Government support under Contract number FA8650-08-C-7838 awarded by (DARPA) Defense Advanced Research Projects Agency. The Government has certain rights in this invention.

FIELD OF THE INVENTION

The present invention relates to transistor devices, and more particularly, to transistor devices having nanoscale material-based channels (e.g., carbon nanotube or graphene channels) and techniques for the fabrication thereof.

BACKGROUND OF THE INVENTION

The integration of carbon nanostructures as channel materials in the next generation of electronic devices offers many advantages over the continued scaling of silicon (Si). Carbon nanotubes and graphene are two nanoscale forms of carbon that exhibit extremely high current carrying capacity and mobilities several orders of magnitude beyond the theoretical limit for Si. Additionally, carbon nanotubes (one-dimensional) and graphene (two-dimensional) are low-dimensional (ultra thin-body) materials, allowing them to be aggressively scaled in field-effect transistors without incurring deleterious short-channel effects that hinder modern scaled devices. See, for example, J. Appenzeller, "Carbon Nanotubes for High-Performance Electronics-Progress and Prospect," Proceedings of the IEEE, vol. 96, no. 2, pp. 201-211 (February 2008), the contents of which are incorporated by reference herein.

One of the foremost challenges to scaling either of these nanomaterials is the difficulty of establishing thin, uniform and high-quality dielectrics on their surfaces. The surface of both materials consists of strong $sp^2$ carbon bonds with nominally no surface states. The absence of open surface bonds makes it nearly impossible to nucleate or deposit insulators, especially with the monolayer accuracy that is needed for scaled gate dielectrics. Approaches to overcoming this obstacle thus far have involved 1) gas-phase functionalization of the carbon surface with a noncovalent monolayer (see, for example, D. Farmer et al., "Atomic Layer Deposition on Suspended Single-Walled Carbon Nanotubes via Gas-Phase Noncovalent Functionalization," Nano Letts., 6(4): 699-703 (2006), the contents of which are incorporated by reference herein), 2) wrapping of carbon nanotubes with molecules (see, for example, Y. Lu et al., "DNA Functionalization of Carbon Nanotubes for Ultrathin Atomic Layer Deposition of High k Dielectrics for Nanotube Transistors with 60 mV/Decade Switching," JACS, vol. 128, pp. 3518-3519 (2006), the contents of which are incorporated by reference herein), 3) overgrowth of dielectric layers to encompass carbon nanotubes (see, for example, A. Javey et al. "High-k Dielectrics for Advanced Carbon-Nanotube Transistors and Logic Gates," Nature Mater., vol. 1, 241-246 (2002), the contents of which are incorporated by reference herein) and 4) deposition of thin (less than two nanometers (nm)) metal followed by its oxidation (see, for example, S. Kim et al., "Realization of a High Mobility Dual-Gated Graphene Field-Effect Transistor with $Al_2O_3$ Dielectric," Applied Physics Letters, vol. 94, pp. 062107 (2009), the contents of which are incorporated by reference herein). All of these approaches are completed by the atomic layer deposition (ALD) of a high-k dielectric.

The first two approaches which provide for good uniformity and dielectrics down to about two nm in thickness have been reported. However, the molecular layers have been shown to interact with the carbon bonds, creating scattering centers that cause the mobility to suffer greatly. In fact, since all carriers are on the surface of these nanostructures the carriers strongly couple to any material that is deposited around them, causing degradation of the transport properties. Additionally, when using molecules such as deoxyribonucleic acid (DNA) to create a nucleation layer around carbon nanotubes the uniformity can be compromised as a result of the relatively large molecule diameter (four nm for DNA) compared to the carbon nanotubes (about 1.5 nm). The last two approaches provide no scheme for scaling the thickness of the dielectric, i.e., from about eight nm to about 15 nm of dielectric is necessary to ensure complete coverage of the carbon surface.

Therefore, device fabrication techniques that avoid the above-described problems associated with forming thin, uniform and high-quality dielectrics on the surfaces of nanomaterials would be desirable.

SUMMARY OF THE INVENTION

The present invention provides transistor devices having nanoscale material-based channels and techniques for the fabrication thereof. In one aspect of the invention, a transistor device includes a substrate; an insulator on the substrate; a gate embedded in the insulator with a top surface of the gate being substantially coplanar with a surface of the insulator; a dielectric layer over the gate and insulator; a channel comprising a carbon nanostructure material formed on the dielectric layer over the gate, wherein the dielectric layer over the gate and the insulator provides a flat surface on which the channel is formed; and source and drain contacts connected by the channel.

In another aspect of the invention, a method of fabricating a transistor device includes the following steps. An insulator on a substrate is provided. A gate is formed embedded in the insulator with a top surface of the gate being substantially coplanar with a surface of the insulator. A dielectric layer is deposited over the gate and the insulator. A channel comprising a carbon nanostructure material is formed on the dielectric layer over the gate, wherein the dielectric layer over the gate and the insulator provides a flat surface on which the channel is formed. Source and drain contacts are formed connected by the channel.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-5 are diagrams illustrating an exemplary methodology for fabricating a transistor device having a channel formed from a nanoscale material, such as carbon nanotubes or graphene. In general, a transistor includes a source and a drain connected by a channel(s), and a gate which regulates electron flow through the channel. The gate is separated from the channel by a dielectric material (a gate dielectric). As will be described in detail below, the present process flow involves forming a local bottom gate and ultra-thin gate dielectric prior to placing the channel over the dielectric, which avoids altogether the above-described problems associated with trying to form the dielectric on the carbon nanotube/graphene material (in this manner, the dielectric thickness and uniformity are entirely independent of the channel material used allowing the device to be scaled aggressively). To do so, the gate needs to be flush with a surrounding insulator, allowing for the channel material to lie flat on the local bottom gate surface. See description below.

Figure 1:
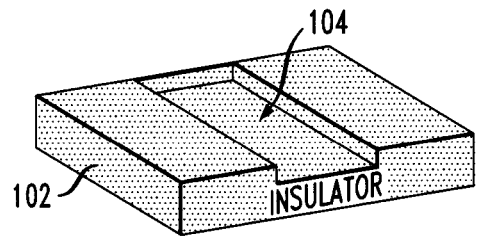
FIG. 1 is a three-dimensional diagram illustrating an insulator layer having been patterned with a trench that marks the footprint and location of a local bottom gate according to an embodiment of the present invention.

To begin the fabrication process, an oxidized substrate is provided. The oxide, for example, silicon dioxide ($SiO_2$), on a silicon (Si) substrate serves as an insulator into which a bottom gate will be formed. Namely, the insulator is then patterned to define a region for forming the local bottom gate. FIG. 1, for example, is a three-dimensional diagram illustrating an insulator 102 having been patterned with a trench 104 that marks the footprint and location of a local bottom gate. The substrate which would be present beneath insulator 102 is not shown in this depiction. According to an exemplary embodiment, the local bottom gate that will be formed in insulator 102 (see below) will provide all of the necessary channel modulation for the device. With such a configuration, doping of the substrate is not needed.

As will be described in detail below, an anisotropic dry etch (e.g., reactive ion etching (RIE)) followed by a wet chemical etch to undercut trench 104 can be performed through a positive resist (e.g., poly(methyl methacrylate) (PMMA)). The undercutting of trench 104 is done to prevent the build-up of gate material that is to be deposited in the next step, thus providing as smooth a surface as possible for channel formation.

Figure 2:
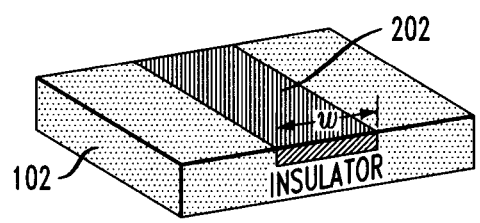
FIG. 2 is a three-dimensional diagram illustrating a gate material having been deposited into the trench to form a gate according to an embodiment of the present invention.

As shown in FIG. 2, a suitable gate material is then deposited into trench 104 to form gate 202. According to one exemplary embodiment, the gate material comprises a metal or a combination of metals deposited, e.g., using electron beam evaporation. Any metal(s) can be used and the particular metal(s) selected may vary for p-channel and n-channel devices to tune the threshold voltage accordingly. By way of example only, suitable gate metals include, but are not limited to aluminum (Al), titanium (Ti) and/or palladium (Pd). In an example provided below, Ti is first deposited into trench 104 followed by Pd.

Alternatively, according to another exemplary embodiment, the gate material comprises poly-silicon (poly-Si). The poly-Si can be doped accordingly to attain the desired work function and conductivity. The techniques for poly-Si gate doping are known to those of skill in the art and thus are not described further herein.

The result is gate 202 embedded in insulator 102. As shown in FIG. 2, a top surface of gate 202 is flush with a surface of insulator 102. Since the surfaces are flush with one another, the top surface of gate 202 is thus coplanar with the surface of insulator 102. The coplanar gate and insulator provide a flat surface on which the channel material can be formed/deposited (see below).

It is notable that the dimensions of gate 202 can be configured to address the specific device needs. By way of example only, a width w of the gate can be varied to tune the channel length and to control an amount by which, if any, the source and drain contacts overlap the gate (see, for example, FIGS. 4 and 5 (described below)). Additionally, a self-aligned device can be implemented, where the source and drain contacts are aligned directly to the respective edges of the local bottom gate (no overlap, or underlap). Changes to the gate dimensions can be realized, for example, by changing the dimensions of the patterned trench (see above). According to an exemplary embodiment, each source or drain contact overlaps the gate by less than or equal to four nm (with zero overlap occurring in the case of a self aligned device as described above).

As highlighted above, in order to be able to use this local bottom gate configuration as a foundation on which a dielectric and then subsequently a carbon nanotube or graphene channel can be built, the gate has to be level or flush (i.e., coplanar) with the surrounding insulator to provide a flat surface (after the gate dielectric is deposited, see below) on which the channel can be formed. This level interface between the gate and surrounding insulator serves to keep the channel material free of any physical distortions, such as kinks or bends, which can adversely affect carrier transport. See, for example, in FIG. 2 where it is shown that a top surface of gate 202 is coplanar with the surface of insulator 102.

It is notable that, due to production tolerances, in practice the top surface of gate 202 might end up being slightly higher or slightly lower than the surface of insulator 102. When the difference between the surfaces is less than or equal to about five nm the surfaces are considered substantially coplanar according to the present teachings. Specifically, if the top surface of gate 202 is less than or equal to about five nm higher than the surface of insulator 102 then the top surface of gate 202 is considered herein to be substantially coplanar with the surface of insulator 102. Similarly, if the top surface of gate 202 is less than or equal to about five nm lower than the surface of insulator 102 then the top surface of gate 202 is considered herein to be substantially coplanar with the surface of insulator 102.

A substantially coplanar gate/insulator surface may be achieved in a number of different ways. One way is to deposit the metal or poly-Si gate material so as to overfill the trench and then polish the deposited gate material, e.g., using chemical-mechanical polishing (CMP), down to the surface of the insulator. The same resist mask, e.g., PMMA, that was used to etch trench 104 can also be used to fill the gate material. Thus another way to achieve a substantially coplanar gate/insulator surface is by depositing the gate material through the PMMA resist mask so as to fill (to the top of, but not overfilling) the trench, and then use lift-off in acetone to remove the PMMA, leaving the metal gate flush with the surrounding insulator (the presence of the resist allows for the gate material to remain only in the trenches, since when the resist is removed the gate material on top of the resist washes away with it).

Figure 3:
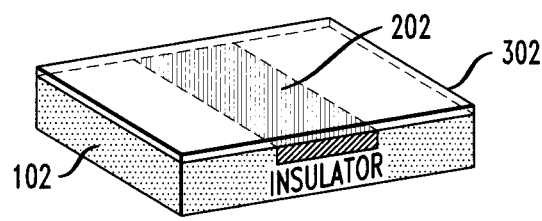
FIG. 3 is a three-dimensional diagram illustrating a dielectric layer having been deposited over the insulator and gate according to an embodiment of the present invention.

As shown in FIG. 3, a dielectric layer 302 which will serve as a gate dielectric of the device is then deposited over insulator 102 and gate 202. According to an exemplary embodiment, dielectric layer 302 comprises aluminum oxide ($Al_2O_3$) or hafnium oxide ($HfO_2$) and is deposited using a chemical vapor deposition (CVD) process such as atomic layer deposition (ALD) to a thickness of less than about 10 nanometers (nm), e.g., to a thickness of from about three nm to about 10 nm.

Establishing an ultra-thin dielectric will lower the screening length of the device, allowing the channel length to be reduced while maintaining long-channel device behavior. Also, the minimum thickness of a dielectric layer (while not leaky) using the present techniques is limited only by the roughness of the gate surface, which can be made nearly atomically smooth using such processes as CMP (see above). In general, the thinner the dielectric layer the better. The challenge, however, is that dielectrics can often be leaky (have leakage current) when too thin. Attempts using conventional processes have not been successful in scaling down dielectrics used with nanoscale materials, such as carbon nanotubes and graphene, mostly because it is very difficult to uniformly nucleate a dielectric on a carbon nanotube or graphene itself. Advantageously, with the present techniques, the thickness of the dielectric layer is completely independent of the channel material, since the dielectric layer is deposited before the carbon nanotubes or graphene are placed. If the gate surface has a roughness of x nm, then the dielectric layer will need to be at least x nm thick in order to provide uniform coverage of the gate surface. Thus, the dielectric layer thickness with the present teachings is limited entirely by the gate surface roughness that it must cover.

As an example, when metal gates are employed herein, the gate metal grain size can affect gate surface roughness and thus may be a factor in choosing the thickness of the dielectric layer (i.e., the smaller the grain size, the thinner the dielectric that can be used). However, processes such as controlled deposition environments and/or CMP can be used to obtain smaller grain sizes allowing for thinner dielectrics (down to a single atomic layer, i.e., a monolayer) to be formed without gate leakage.

Figure 4:
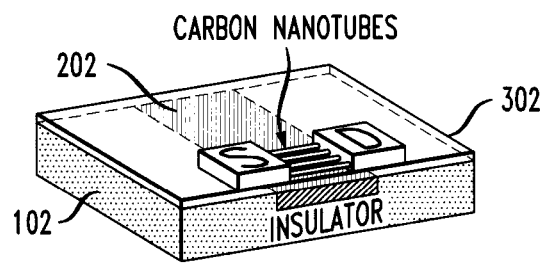
FIG. 4 is a three-dimensional diagram illustrating a carbon nanotube channel having been formed on the dielectric layer over the gate and source and drain contacts having been formed on opposite sides of the carbon nanotube channel according to an embodiment of the present invention.
Figure 5:
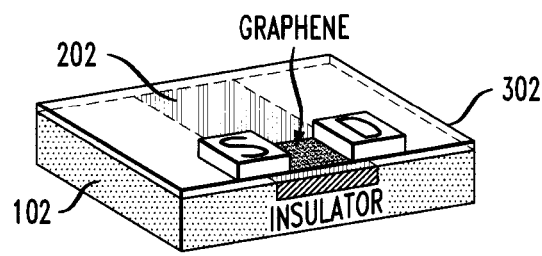
FIG. 5 is a three-dimensional diagram illustrating a graphene channel having been formed on the dielectric layer over the gate and source and drain contacts having been formed on opposite sides of the graphene channel according to an embodiment of the present invention.

Next, a carbon nanostructure material, such as carbon nanotubes (FIG. 4) or graphene (FIG. 5), is formed on dielectric layer 302 over gate 202 which will serve as a channel of the transistor. A variety of methods can be used to form the carbon nanotube/graphene channel on the dielectric layer. By way of example only, transfer techniques such as transfer from a growth substrate for carbon nanotubes or exfoliation for graphene can be employed. These transfer processes are known to those of skill in the art and thus are not described further herein. Alternatively, the carbon nanotubes can be deposited on the dielectric layer, for example, from a carbon nanotube solution using a spin-casting process, or can be grown on the dielectric layer (e.g., by patterning some catalyst particles near the gate and then using CVD to synthesize carbon nanotubes which grow over the neighboring gate). As shown in FIGS. 4 and 5, source and drain contacts, labeled "S" and "D," respectively, are also formed on opposite sides of the carbon nanotube/graphene channel. The source and drain contacts may be formed by depositing metal through a resist mask and then lifting off. A variety of other suitable methods known to those of skill in the art may be similarly employed to form the source and drain contacts.

Figure 6:
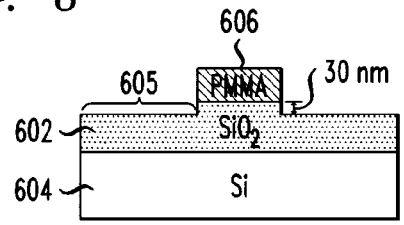
FIG. 6 is a cross-sectional diagram illustrating a dry etch through a patterned poly (methyl methacrylate) (PMMA) resist mask having been used to define trenches in a silicon dioxide ($SiO_2$) insulator wherein local bottom gates are formed according to an embodiment of the present invention.

A specific example implementing the above-described process to form local bottom gates flush with a surrounding insulator is now provided. In this example, as compared with description above, multiple local bottom gates are formed. In practice, if complete transistor devices were being fabricated, each local bottom gate would be associated with a different device (i.e., there is one gate per device). An oxidized substrate is provided having a $SiO_2$ (insulator) layer over a Si substrate. See, for example, FIG. 6 wherein the oxidized substrate includes $SiO_2$ (insulator) layer 602 over Si substrate 604. A two-step etch (dry and wet etching) process is then used to define trenches 605 where the local bottom gates are formed. Namely, the desired gate dimensions are first defined in a PMMA resist mask 606 using electron beam lithography. After development, the PMMA is used to mask the RIE (dry etch) of $SiO_2$ insulator layer 602 to a depth of about 30 nm.

Figure 7:
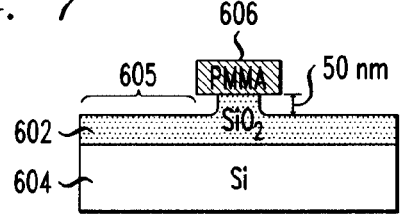
FIG. 7 is a cross-sectional diagram illustrating a wet etch having been used to undercut the PMMA and to increase the overall depth of the trenches according to an embodiment of the present invention.
Figure 8:
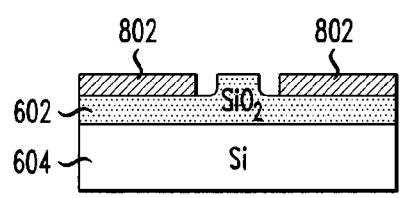
FIG. 8 is a cross-sectional diagram illustrating metal layers having been deposited in the trenches followed by a lift-off process which results in metal gates being formed that are flush with the surrounding insulator according to an embodiment of the present invention.

The next step in the etching process, as shown in FIG. 7, involves a short (e.g., about 20 seconds) dip etch in buffered oxide etch (BOE) 9:1 (wet etch) which serves to undercut the PMMA and to bring the overall etch depth of the trenches to about 50 nm. Next, as shown in FIG. 8, Ti is deposited into the trenches (using electron beam evaporation) to a thickness of about 10 nm followed by Pd being deposited (using electron beam evaporation) over the Ti to a thickness of about 40 nm forming gate metal stack 802. For ease of depiction, the individual (i.e., Ti/Pd) metal layers are shown as a common metal stack. A lift-off in acetone removes the PMMA, leaving the metal gates flush (i.e., coplanar) with the surrounding $SiO_2$.

Figure 9:
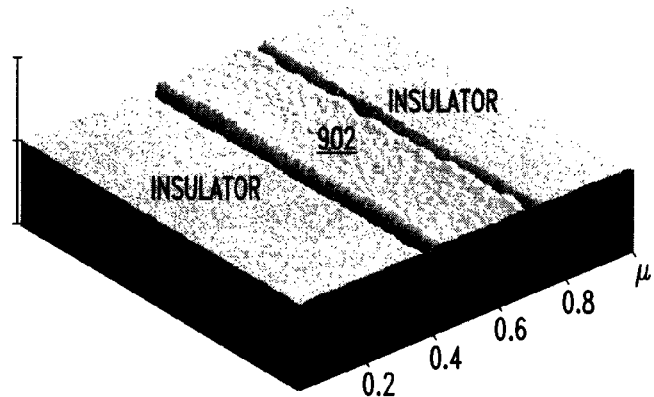
FIG. 9 is an atomic force microscope (AFM) image of a local bottom gate according to an embodiment of the present invention.
Figure 10:
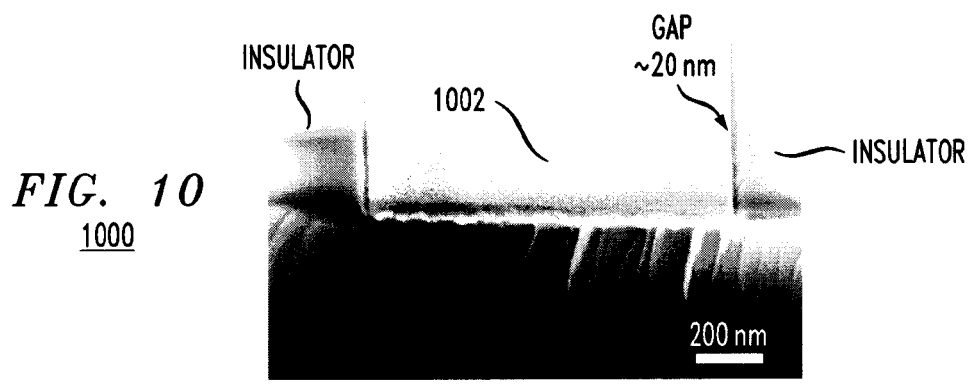
FIG. 10 is a scanning electron microscope (SEM) image of a local bottom gate according to an embodiment of the present invention.

FIG. 9 is an atomic force microscope (AFM) image 900 of a local bottom gate 902 formed using the above-described process. Local bottom gate 902 was formed from Pd and as shown in FIG. 9 has a width of about 200 nm. FIG. 10 is a scanning electron microscope (SEM) image 1000 of a local bottom gate 1002 formed using the above-described process. Local bottom gate 1002 was also formed from Pd and as shown in FIG. 10 has a width of about one micrometer (μm). Each of local bottom gates 902 and 1002 shown in FIGS. 9 and 10, respectively, are flush (i.e., coplanar) with the surrounding insulator, e.g., SiO$_2$. The slight gap between the edge of the metal gate and the insulator (about 20 nm, see for example FIG. 10) is a consequence of undercutting the PMMA during the wet etch step. Without this undercut, the metal would contain large built-up 'fences' at each edge, compromising the smoothness of the metal-insulator surface.

Figure 11:
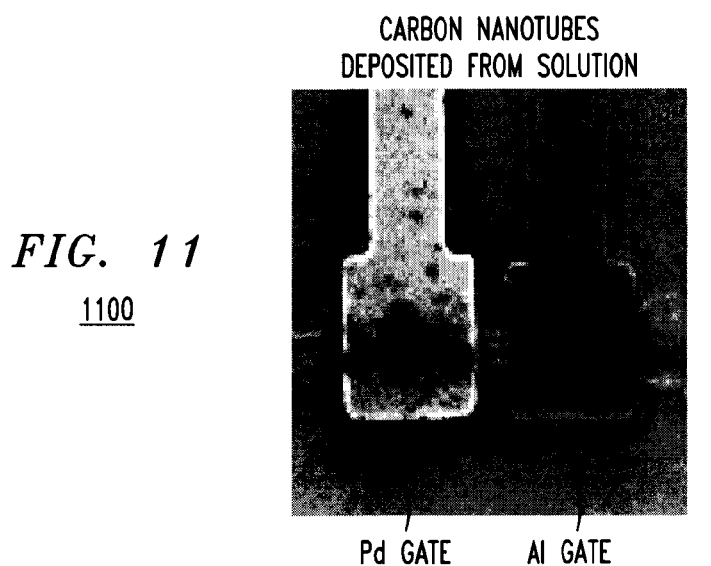
FIG. 11 is a SEM image of a palladium (Pd) metal gate and an aluminum (Al) metal gate, both covered with a hafnium oxide ($HfO_2$) dielectric layer, on which carbon nanotubes were deposited from solution according to an embodiment of the present invention.
Figure 12:
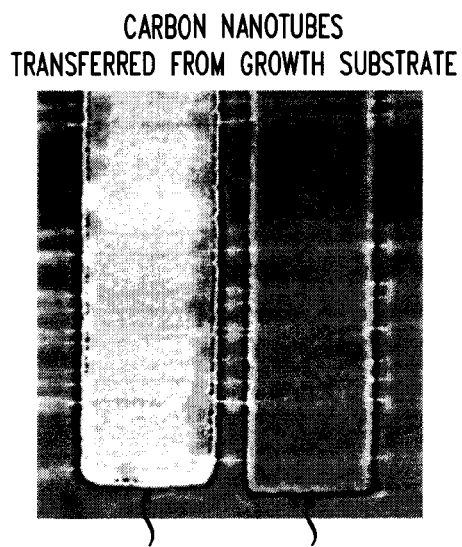
FIG. 12 is a SEM image of a Pd metal gate and an Al metal gate, both covered with a $HfO_2$ dielectric layer, on which carbon nanotubes were transferred from a growth substrate according to an embodiment of the present invention.

As a further example, two different types of metal gates (Pd and Al) were prepared and covered with an about 10 nm thick HfO$_2$ dielectric layer using the above-described techniques. Carbon nanotubes were then dispersed onto the gates using two different techniques: 1) deposition from solution (see image 1100 of FIG. 11) and 2) transfer from growth substrate (see image 1200 of FIG. 12). As highlighted above, each transistor device employs one gate, i.e., there is one gate per transistor device.

Thus, in conclusion, the present techniques advantageously provide a novel local bottom gate geometry that provides a platform for integrating carbon nanotubes or graphene into devices with ultra-thin gate dielectrics. The local bottom gates allow the dielectric to be aggressively scaled without the need for mobility degrading processes such as chemical or molecular functionalization. Employment of the instant techniques with carbon nanotubes or graphene can advance these nanoscale materials toward large-scale integration.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A transistor device, comprising:
    a substrate;
    an insulator on the substrate;
    a gate embedded in the insulator with a top surface of the gate being substantially coplanar with a surface of the insulator;
    a dielectric layer over the gate and insulator;
    a channel comprising a carbon nanostructure material formed on the dielectric layer over the gate, wherein the dielectric layer over the gate and the insulator provides a flat surface on which the channel is formed; and
    source and drain contacts connected by the channel.

2. The device of claim 1, wherein the carbon nanostructure material comprises carbon nanotubes.

3. The device of claim 1, wherein the carbon nanostructure material comprises graphene.

4. The device of claim 1, wherein the insulator comprises silicon dioxide.

5. The device of claim 1, wherein the gate comprises one or more metals.

6. The device of claim 1, wherein the gate comprises polysilicon.

7. The device of claim 1, wherein the dielectric layer comprises one or more of aluminum oxide and hafnium oxide.

8. The device of claim 1, wherein the dielectric layer has a thickness of less than about 10 nm.

9. The device of claim 8, wherein the dielectric layer comprises a monolayer.

10. The device of claim 1, wherein the substrate is undoped.

11. The device of claim 1, wherein the substrate comprises a silicon substrate.

12. The device of claim 5, wherein the gate comprise aluminum, titanium, palladium and combinations thereof.

13. The device of claim 5, wherein the gate comprises titanium and palladium.

14. The device of claim 1, wherein each of the source and drain contacts overlaps the gate by less than or equal to 4 nm.

15. The device of claim 1, wherein the dielectric layer has a thickness of from about 3 nm to about 10 nm.

* * * * *